United States Patent
Torii et al.

(10) Patent No.: US 10,818,356 B2
(45) Date of Patent: Oct. 27, 2020

(54) NONVOLATILE SEMICONDUCTOR MEMORY DEVICE

(71) Applicant: UNITED SEMICONDUCTOR JAPAN CO., LTD, Kuwana-Shi, Mie (JP)

(72) Inventors: Satoshi Torii, Kuwana (JP); Shu Ishihara, Kuwana (JP)

(73) Assignee: UNITED SEMICONDUCTOR JAPAN CO., LTD., Kuwana-shi, Mie (JP)

(*) Notice: Subject to any disclaimer, the term of this patent is extended or adjusted under 35 U.S.C. 154(b) by 0 days.

(21) Appl. No.: 16/263,604

(22) Filed: Jan. 31, 2019

(65) Prior Publication Data

US 2019/0333580 A1 Oct. 31, 2019

(30) Foreign Application Priority Data

Apr. 25, 2018 (JP) .................... 2018-084086

(51) Int. Cl.
*G11C 16/04* (2006.01)
*H01L 27/11529* (2017.01)
*H01L 27/11524* (2017.01)
*G11C 16/26* (2006.01)

(52) U.S. Cl.
CPC .......... *G11C 16/0433* (2013.01); *G11C 16/26* (2013.01); *H01L 27/11524* (2013.01); *H01L 27/11529* (2013.01)

(58) Field of Classification Search
CPC ............. G11C 16/0433; G11C 16/26; H01L 27/11529; H01L 27/11524

USPC ...................................................... 365/185.17
See application file for complete search history.

(56) References Cited

U.S. PATENT DOCUMENTS

| | | | |
|---|---|---|---|
| 5,687,118 A | 11/1997 | Chang | |
| 5,912,842 A * | 6/1999 | Chang | G11C 16/0416 365/185.11 |
| 6,014,328 A | 1/2000 | Onakado et al. | |
| 2004/0012039 A1 * | 1/2004 | Shirota | H01L 27/11529 257/200 |
| 2005/0018500 A1 | 1/2005 | Ditewig et al. | |
| 2008/0080244 A1 * | 4/2008 | Lee | G11C 8/10 365/185.13 |
| 2010/0091572 A1 | 4/2010 | Choi | |

FOREIGN PATENT DOCUMENTS

| | | |
|---|---|---|
| JP | 11-87658 A | 3/1999 |
| JP | 2001-506063 A | 5/2001 |
| JP | 2004-228396 A | 8/2004 |
| JP | 2005-512268 A | 4/2005 |
| JP | 2005-122772 A | 5/2005 |
| JP | 2010-514196 A | 4/2010 |

* cited by examiner

*Primary Examiner* — Huan Hoang
(74) *Attorney, Agent, or Firm* — Westerman, Hattori, Daniels & Adrian

(57) ABSTRACT

A nonvolatile semiconductor memory device includes a selection transistor and a memory transistor that are formed on a well for each of a plurality of memory cells. At a time of a data read from the memory transistor, a first voltage is applied to the well and a source of the memory transistor, and a second voltage is applied to a gate of the selection transistor included in a non-selected memory cell among the plurality of memory cells. The first voltage is smaller than an absolute value of the second voltage.

15 Claims, 14 Drawing Sheets

US 10,818,356 B2

NONVOLATILE SEMICONDUCTOR MEMORY DEVICE

CROSS-REFERENCE TO RELATED APPLICATIONS

This application is based upon and claims the benefit of priority of the prior Japanese Patent Application No. 2018-084086, filed on Apr. 25, 2018, the entire contents of which are incorporated herein by reference.

FIELD

The embodiments discussed herein are related to a nonvolatile semiconductor memory device.

BACKGROUND

Among nonvolatile memories, there is a nonvolatile memory that includes a pair of a selection transistor and a memory transistor for each memory cell. Such a memory cell is sometimes referred to as a 2Tr cell, and the nonvolatile memory including such 2Tr cells are suited for die shrink (or process shrink).

Recently, there are demands to reduce a leak current in the nonvolatile memory including the 2Tr cells.

Background art includes devices proposed in Japanese National Publication of International Patent Application No. 2001-506063, and Japanese Laid-Open Patent Publications No. 11-87658, and No. 2005-122772, for example.

SUMMARY

According to one aspect of the embodiments, a nonvolatile semiconductor memory device includes a selection transistor and a memory transistor that are formed on a well for each of a plurality of memory cells, wherein, at a time of a data read from the memory transistor, a first voltage is applied to the well and a source of the memory transistor, and a second voltage is applied to a gate of the selection transistor included in a non-selected memory cell among the plurality of memory cells, and wherein the first voltage is smaller than an absolute value of the second voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A leak current of a nonvolatile memory will first be described based on reference examples.

(2Tr Cell)

Figure 1A:
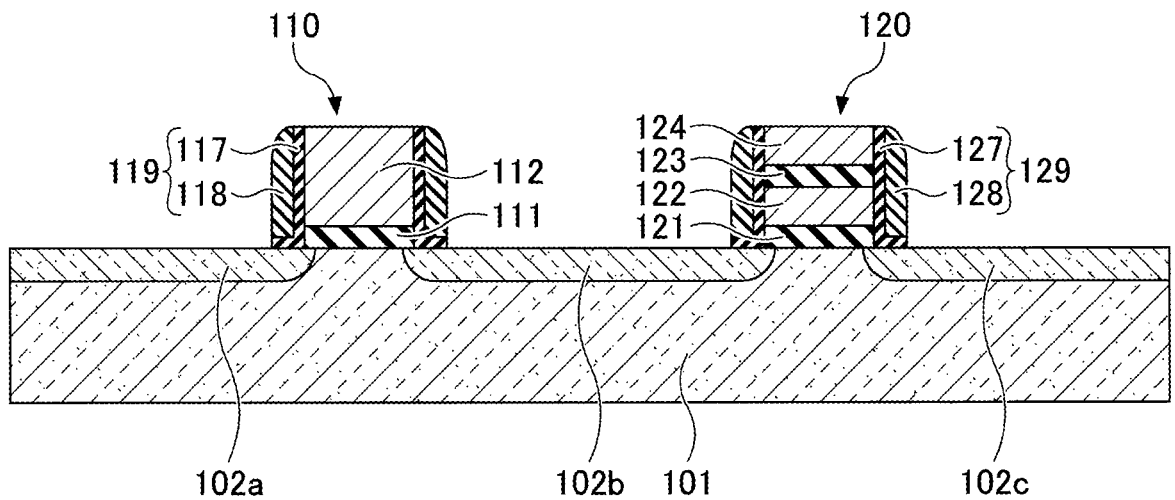
FIG. 1A and FIG. 1B are diagrams illustrating structures of a selection transistor and a memory transistor.
Figure 1B:
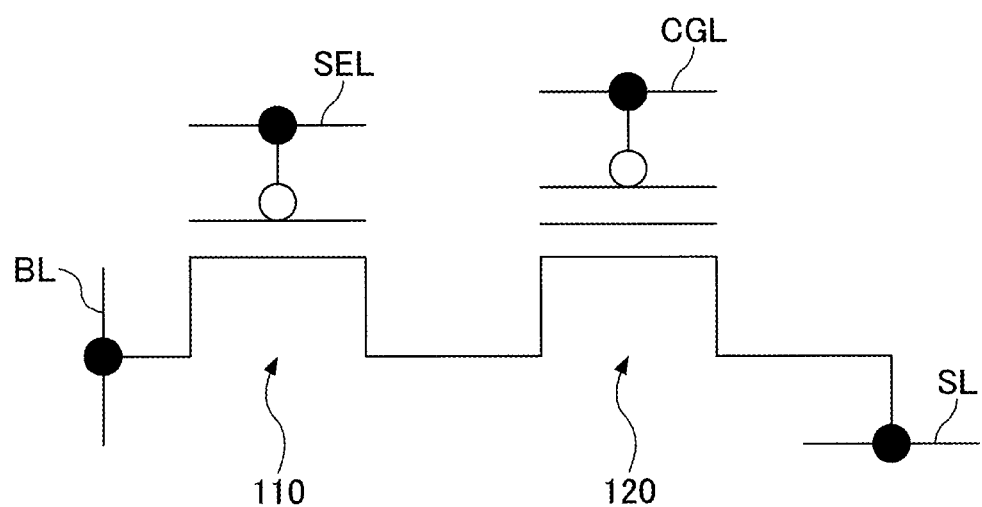

First, a structure of a memory cell including a pair of a selection transistor and a memory transistor, that is, a 2Tr cell, will be described. FIG. 1A and FIG. 1B are diagrams illustrating the structures of the selection transistor and the memory transistor included in the 2Tr cell. FIG. 1A is a cross sectional view, and FIG. 1B is a circuit diagram.

As illustrated in FIG. 1A, a selection transistor 110 and a memory transistor 120 are formed on a first conductivity type well 101. The selection transistor 110 includes a gate insulator layer 111 on the well 101, and a gate electrode 112. A sidewall 119 that includes an insulator layer 117 and an insulator layer 118 is formed on sidewalls of the gate insulator layer 111 and the gate electrode 112. The selection transistor 110 includes second conductivity type impurity diffusion regions 102a and 102b that are formed on a surface of the well 101 so as to sandwich the gate electrode 112 in a plan view. The memory transistor 120 includes a gate insulator layer 121 on the well 101, a floating gate 122, an intermediate insulator layer 123, and a control gate 124. A sidewall 129 that includes an insulator layer 127 and an insulator layer 128 are formed on sidewalls of the gate insulator layer 121, the floating gate 122, the intermediate insulator layer 123, and the control gate 124. The memory transistor 120 includes second conductivity type impurity diffusion regions 102b and 102c that are formed on the surface of the well 101 so as to sandwich the control gate 124 in the plan view. The impurity diffusion region 102b is used in common and shared by the selection transistor 110 and the memory transistor 120.

The impurity diffusion region 102b is shared by the selection transistor 110 and the memory transistor 120, and as illustrated in FIG. 1B, a source of the selection transistor 110 and a drain of the memory transistor 120 are connected.

A gate (gate electrode 112) of the selection transistor 110 is connected to a selection line SEL, and a drain (impurity diffusion region 102a) of the selection transistor 110 is connected to a bit line BL. A control gate (control gate 124) of the memory transistor 120 is connected to a control line CGL, and a source (impurity diffusion region 102c) of the memory transistor 120 is connected to a source line SL.

For example, the 2Tr cell has the structure described above.

First Reference Example

Figure 2A:
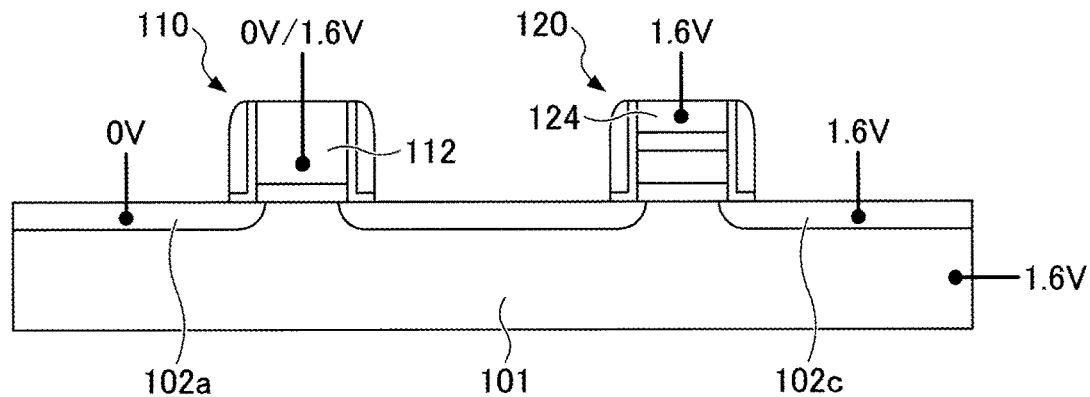
FIG. 2A, FIG. 2B, and FIG. 2C are diagrams illustrating voltages applied to a first reference example.
Figure 2B:
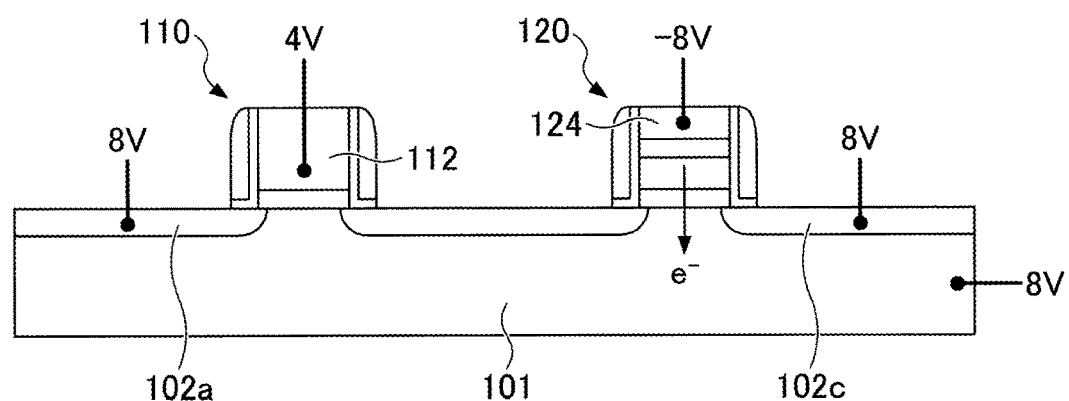
Figure 2C:
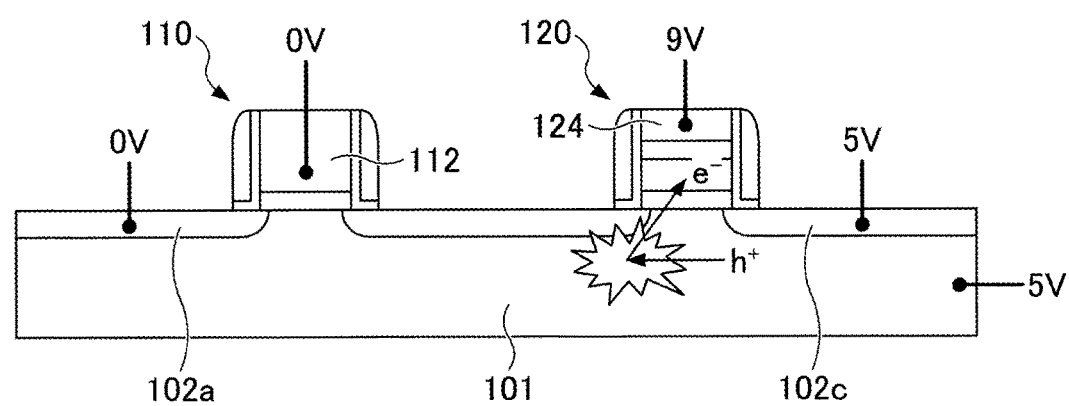

Next, a structure of a first reference example will be described. In the first reference example, p-channel MOS (Metal Oxide Semiconductor) transistors are used for the selection transistor and the memory transistor. Accordingly, the conductivity type of the well 101 is the n-type, and the conductivity type of the impurity diffusion regions 102a, 102b, and 102c is the p-type. FIG. 2A, FIG. 2B, and FIG. 2C are diagrams illustrating voltages applied to the first reference example. FIG. 2A illustrates the voltages at a time of a data read, FIG. 2B illustrates the voltages at a time of a data erase, and FIG. 2C illustrates the voltages at a time of a data write. In this example, it is assumed for the sake of convenience that a threshold voltage Vth of the selection transistor 110 is −1.6 V or higher and 0 V or lower.

As illustrated in FIG. 2A, at the time of the data read, a voltage of 1.6 V is applied to the well 101, the impurity diffusion region 102c, and the control gate 124, and a voltage of 0 V is applied to the impurity diffusion region 102a. In addition, a voltage of 1.6 V is applied to the gate electrode 112 when the memory cell is in standby or non-selected, and a voltage of 0 V is applied to the gate electrode 112 when the memory cell is selected. By applying the voltage of 0 V to the gate electrode 112, the selection transistor 110 turns on, to read the data stored in the memory transistor 120 onto the bit line BL.

As illustrated in FIG. 2B, at the time of the data erase, a voltage of 8 V is applied to the well 101, the impurity diffusion region 102a, and the impurity diffusion region 102c, a voltage of −8 V is applied to the control gate 124, and a voltage of 4 V is applied to the gate electrode 112. By applying such voltages, electrons injected into the floating gate 122 are extracted from the well 101 utilizing the Fowler-Nordheim (FN) tunneling, to erase the data.

As illustrated in FIG. 2C, at the time of the data write, a voltage of 5 V is applied to the well 101 and the impurity diffusion region 102c, a voltage of 9 V is applied to the control gate 124, and a voltage of 0 V is applied to the gate electrode 112 and the impurity diffusion region 102a. By applying such voltages, electrons are injected into the floating gate 122 utilizing the impact ionization, to write the data.

The following Table 1 illustrates these voltages that are summarized.

TABLE 1

| | Reference Numeral | | | | |
|---|---|---|---|---|---|
| | 102a | 112 | 124 | 102c | 101 |
| Data Read | 0 V | 0 V/1.6 V (Selected/Non-Selected) | 1.6 V | 1.6 V | 1.6 V |
| Data Erase | 8 V | 4 V | −8 V | 8 V | 8 V |
| Data Write | 0 V | 0 V | 5 V | 5 V | 5 V |

Figure 3A:
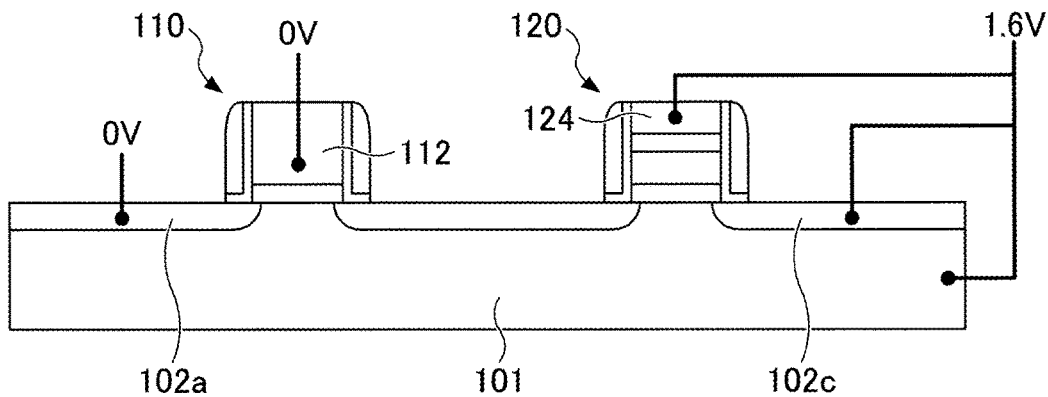
FIG. 3A, FIG. 3B, and FIG. 3C are diagrams illustrating voltages applied at a time of a data read and a distribution of a threshold voltage of the selection transistor in the first reference example.
Figure 3B:
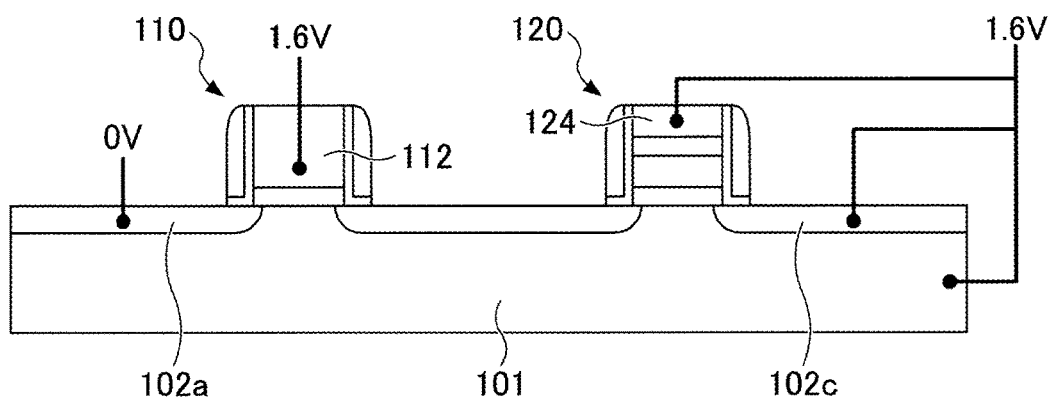
Figure 3C:
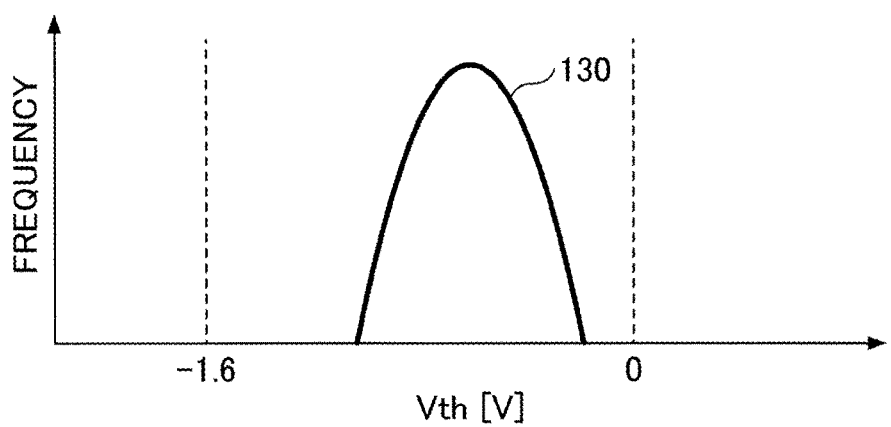

Next, the voltages applied at the time of the data read and a distribution of the threshold voltage of the selection transistor in the first reference example will be described. FIG. 3A, FIG. 3B, and FIG. 3C are diagrams illustrating the voltages applied at the time of the data read and the distribution of the threshold voltage of the selection transistor in the first reference example. In a case in which the voltages described above are applied at the time of the data read, the voltages illustrated in FIG. 3A are applied to the selected memory cell, and the voltage illustrated in FIG. 3B are applied to the non-selected memory cell. As described above, the threshold voltage Vth of the selection transistor 110 is −1.6 V or higher and 0 V or lower. In a case in which a selection transistor 110 having the threshold voltage Vth lower than −1.6 V is included in the memory cell, this selection transistor 110 may not turn on even if the voltage of 0 V is applied to the gate electrode 112 when this memory cell is selected, and consequently, an error may be generated in a data judgment of this memory cell. In addition, in a case in which a selection transistor 110 having the threshold voltage Vth exceeding 0 V is included in the memory cell, this selection transistor 110 may remain on even if the voltage of 1.6 V is applied to the gate electrode 112 when this memory cell is non-selected, and consequently, an error may be generated in a data judgment of another memory cell that shares the bit line BL with this memory cell that is non-selected. As illustrated in FIG. 3C, when a distribution 130 of the threshold voltage Vth of the selection transistor 110 falls within a range that is −1.6 V or higher and 0 V or lower, the above described errors in the data judgment are unlikely generated. In each of the distributions illustrated in FIG. 3C and FIG. 4B, FIG. 5B, FIG. 7A through FIG. 7C, FIG. 8C, and FIG. 9C which will be described later, the ordinate indicates a frequency in arbitrary units, and the abscissa indicates the threshold voltage Vth [V].

However, a leak current flows even if the threshold voltage Vth of the selection transistor 110 is −1.6 V or higher and 0 V or lower, and the voltage of 1.6 V is applied to the gate electrode 112 at the time when the memory cell is non-selected. Particularly the leak current flowing to the bit line BL may generate the error in the data judgment.

Figure 4A:
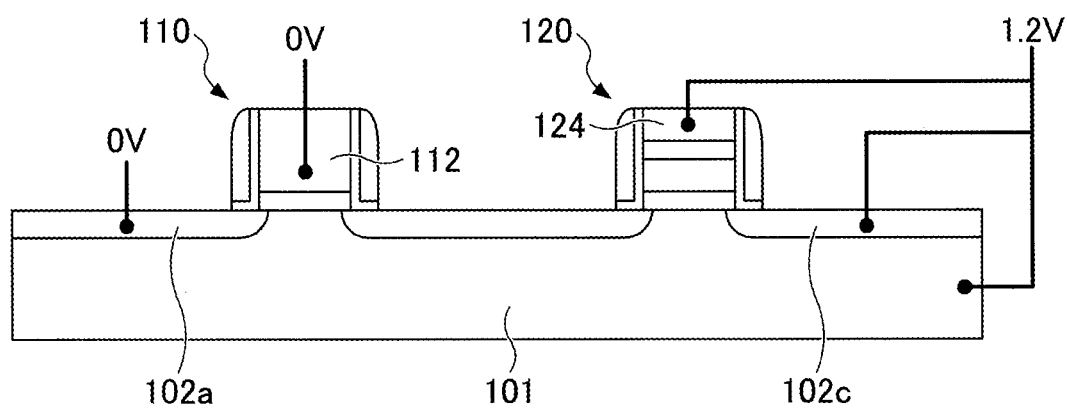
FIG. 4A and FIG. 4B are diagrams illustrating voltages applied to a memory cell selected at the time of the data read and the distribution of the threshold voltage of the selection transistor in the first reference example.
Figure 4B:
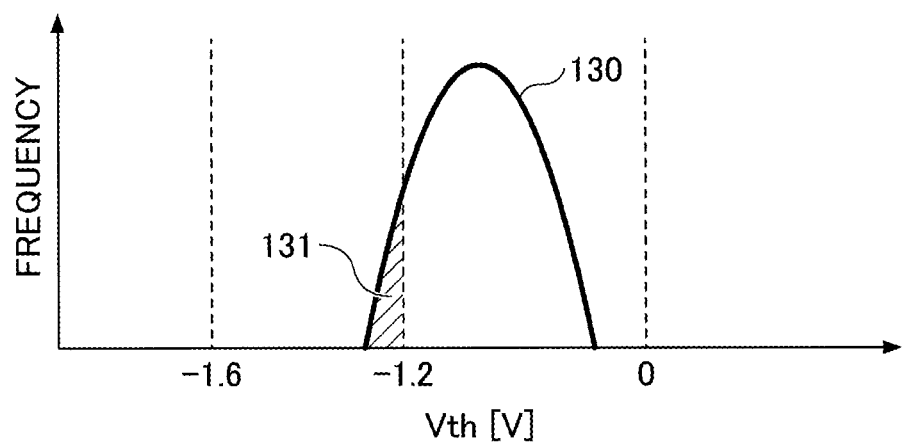

In order to reduce the leak current, it is conceivable to lower the voltage that is applied to the well 101, the impurity diffusion region 102c, and the control gate 124 at the time of the data read. The lowering of the voltage is also effective in the so-called widening of a range of the power source voltage. FIG. 4A is a diagram illustrating voltages applied to the memory cell at a time of selection, to reduce the leak current, and FIG. 4B is a diagram illustrating the distribution of the threshold voltage of the selection transistor. In this case, in the selected memory cell, a voltage lower than 1.6 V, such as a voltage of 1.2 V, for example, is applied to the well 101, the impurity diffusion region 102c, and the control gate 124, and a voltage of 0 V is applied to the impurity diffusion region 102a and the gate electrode 112, as illustrated in FIG. 4A. In other words, compared to the example illustrated in FIG. 3A, the voltage applied to the well 101, the impurity diffusion region 102c, and the control gate 124 is 0.4 V lower. In addition, even in the non-selected memory cell, the voltage applied to the well 101, the impurity diffusion region 102c, and the control gate 124 is 0.4 V lower compared to the example illustrated in FIG. 3B. The leak current can be reduced by an amount the applied voltage is lowered.

However, when the distribution 130 of the threshold voltage Vth of the selection transistor 110 is similar to that illustrated in FIG. 3C, a selection transistor 110 having the threshold voltage Vth lower than −1.2 V exists. In other words, as illustrated in FIG. 4B, a region 131 indicated by hatchings, in which the threshold voltage Vth is lower than −1.2 V, is included in the distribution 130, and the selection transistor 110 having the threshold voltage Vth lower than −1.2 V will not turn on when the voltage of 0 V is applied to the gate electrode 112 when the memory cell is selected. Accordingly, an error may be generated in the data judgment of the memory cell that is selected.

Figure 5A:
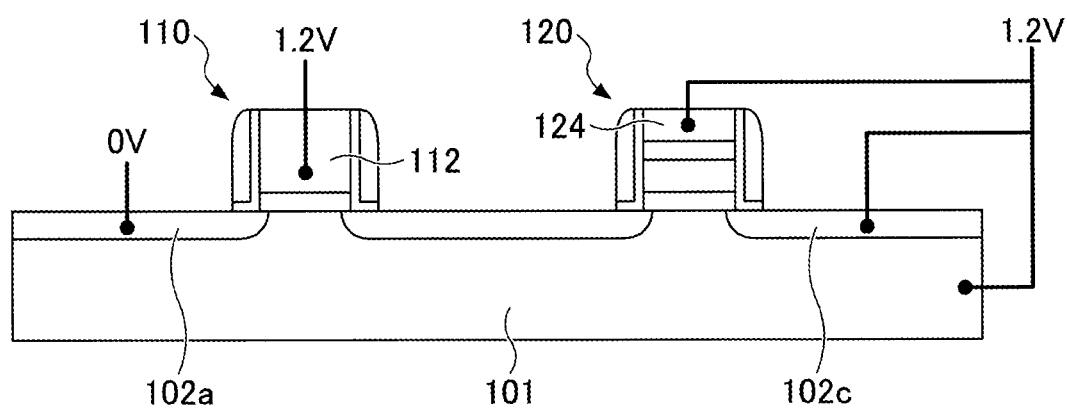
FIG. 5A and FIG. 5B are diagrams illustrating voltages applied to a non-selected memory cell at the time of the data read and the distribution of the threshold voltage of the selection transistor in the first reference example.
Figure 5B:
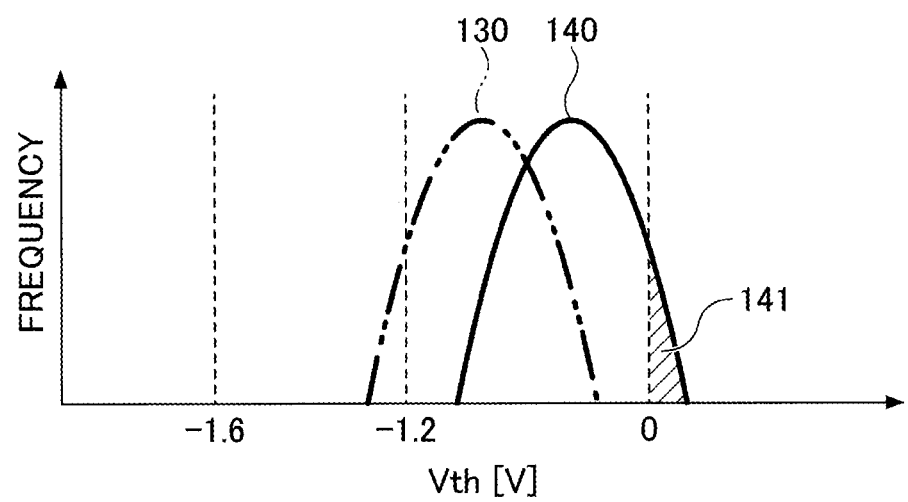

In order to eliminate the error in the data judgment of the selected memory cell in which selection transistor 110 has the threshold voltage Vth lower than −1.2 V, it is conceivable to shift the threshold voltage Vth of the selection transistor 110 to a higher voltage. The threshold voltage Vth may be adjusted by an impurity concentration or the like. FIG. 5A is a diagram illustrating voltages applied to a non-selected memory cell, in order to reduce the leak current at the time of selecting the memory cell. FIG. 5B is a diagram illustrating a distribution of the threshold voltage of the selection transistor, in order to reduce the leak current at the time of selecting the memory cell. In this case, in the non-selected memory cell, a voltage of 1.2 V is applied to the well 101, the impurity diffusion region 102c, the control gate 124, and the gate electrode 112, and a voltage of 0 V is applied to the impurity diffusion region 102a, as illustrated in FIG. 5A. In other words, compared to the example illustrated in FIG. 3B, the voltage applied to the well 101, the impurity diffusion region 102c, the control gate 124, and the gate electrode 112 is 0.4 V lower. In addition, as illustrated in FIG. 5B, a distribution 140 of the threshold voltage Vth of the selection transistor 110 is shifted to a higher voltage range compared to the distribution 130 illustrated in FIG. 3C, and it is possible to eliminate the selection transistor 110 having the threshold voltage Vth lower than −1.2 V.

However, a selection transistor 110 having the threshold voltage Vth higher than 0 V may exist. In other words, as illustrated in FIG. 5B, the distribution 140 includes a region 141 in which the threshold voltage Vth is higher than 0 V, and the selection transistor 110 having the threshold voltage Vth higher than 0 V will remain on even if the voltage of 1.2 V is applied to the gate electrode 112 at the time when the memory cell is non-selected. Accordingly, an error may be generated in the data judgment of another memory cell that shares the bit line BL with the non-selected memory cell.

Hence, according to the first reference example, the leak current cannot be avoided. In addition, in a case in which the applied voltage is lowered or the threshold voltage Vth is changed in the first reference example, the data judgment may be adversely affected thereby.

Second Reference Example

Figure 6A:
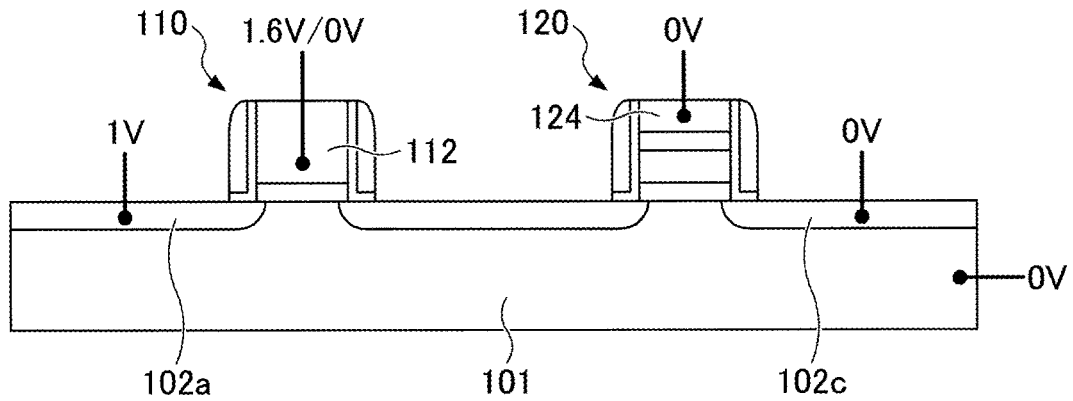
FIG. 6A, FIG. 6B, and FIG. 6C are diagrams illustrating voltages applied to a second reference example.
Figure 6B:
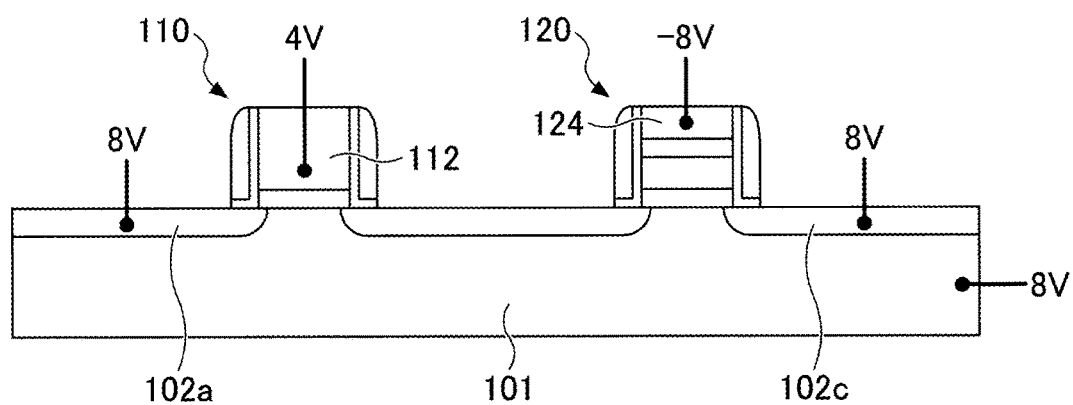
Figure 6C:
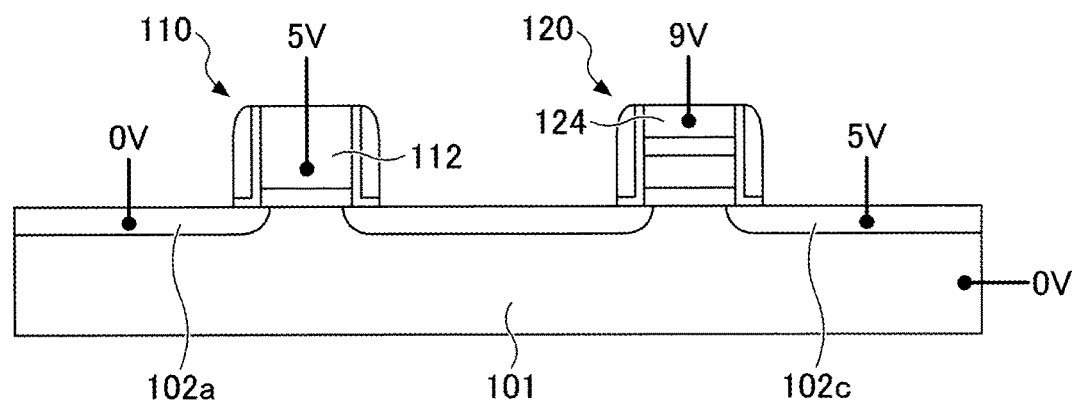

Next, a second reference example will be described. In the first reference example, the p-channel MOS transistors are used for the selection transistor and the memory transistor. On the other hand, in the second reference example, n-channel MOS transistors are used for the selection transistor and the memory transistor. Accordingly, the conductivity type of the well 101 is the p-type, and the conductivity type of the impurity diffusion regions 102a, 102b, and 102c is the n-type. The operation of the second reference example will now be described. FIG. 6A, FIG. 6B, and FIG. 6C are diagrams illustrating voltages applied to the second reference example. FIG. 6A illustrates the applied voltages at the time of the data read, FIG. 6B illustrates the applied voltages at the time of the data erase, and FIG. 6C illustrates the applied voltages at the time of the data write. In this example, it is assumed for the sake of convenience that the threshold voltage Vth of the selection transistor 110 is 0 V or higher and 1.6 V or lower.

As illustrated in FIG. 6A, at the time of the data read, a voltage of 0 V is applied to the well 101, the impurity diffusion region 102c, and the control gate 124, and a voltage of 1 V is applied to the impurity diffusion region 102a. In addition, a voltage of 0 V is applied to the gate electrode 112 when the memory cell is in standby or non-selected, and a voltage of 1.6 V is applied to the gate electrode 112 when the memory cell is selected. By applying the voltage of 1.6 V to the gate electrode 112, the selection transistor 110 turns on, to read the data stored in the memory transistor 120 onto the bit line BL.

As illustrated in FIG. 6B, at the time of the data erase, a voltage of 8 V is applied to the well 101, the impurity diffusion region 102a, and the impurity diffusion region 102c, a voltage of −8 V is applied to the control gate 124, and a voltage of 4 V is applied to the gate electrode 112. By applying such voltages, electrons injected into the floating gate 122 are extracted from the well 101 utilizing the Fowler-Nordheim (FN) tunneling, to erase the data.

As illustrated in FIG. 6C, at the time of the data write, a voltage of 0 V is applied to the well 101 and the impurity diffusion region 102a, a voltage of 9 V is applied to the control gate 124, and a voltage of 5 V is applied to the gate electrode 112 and the impurity diffusion region 102c. By applying such voltages, electrons are injected into the floating gate 122 utilizing the channel hot electrons, to write the data.

The following Table 2 illustrates these voltages that are summarized.

TABLE 2

| | Reference Numeral | | | | |
|---|---|---|---|---|---|
| | 102a | 112 | 124 | 102c | 101 |
| Data Read | 1 V | 1.6 V/0 V (Selected/Non-Selected) | 0 V | 0 V | 0 V |
| Data Erase | 8 V | 4 V | −8 V | 8 V | 8 V |
| Data Write | 0 V | 5 V | 9 V | 5 V | 0 V |

In the second reference example, an error in the data judgment is unlikely generated if the distribution of the threshold voltage Vth of the selection transistor 110 falls within a range that is 0 V or higher and 1.6 V or lower. However, similarly as in the case of the first reference example, a leak current flows even if the threshold voltage Vth of the selection transistor 110 is 0 V or higher and 1.6 V or lower, and a voltage of 0 V is applied to the gate electrode 112 at the time when the memory cell is non-selected. Particularly the leak current flowing to the bit line BL may generate the error in the data judgment.

Figure 7A:
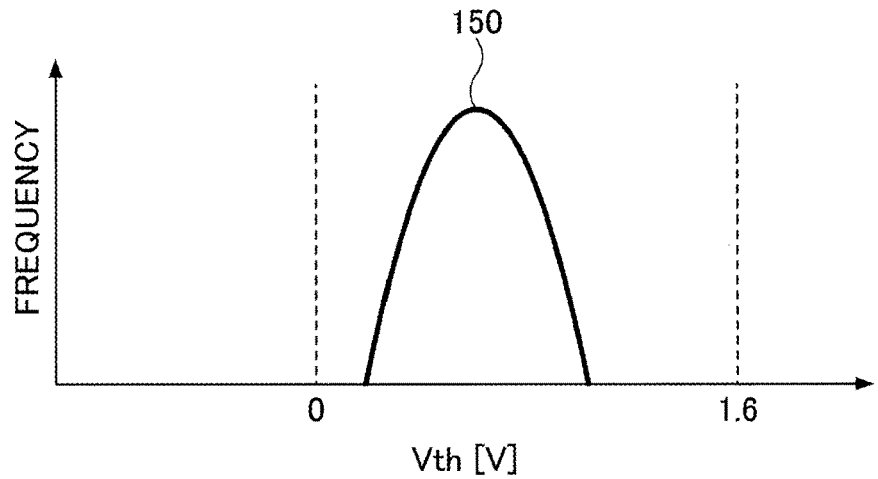
FIG. 7A, FIG. 7B, and FIG. 7C are diagrams illustrating distributions of the threshold voltage of the selection transistor in the second reference example.

In order to reduce the leak current, it is conceivable to adjust the applied voltages or the threshold voltage in a manner similar to the first reference example. FIG. 7A, FIG.

Figure 7B:
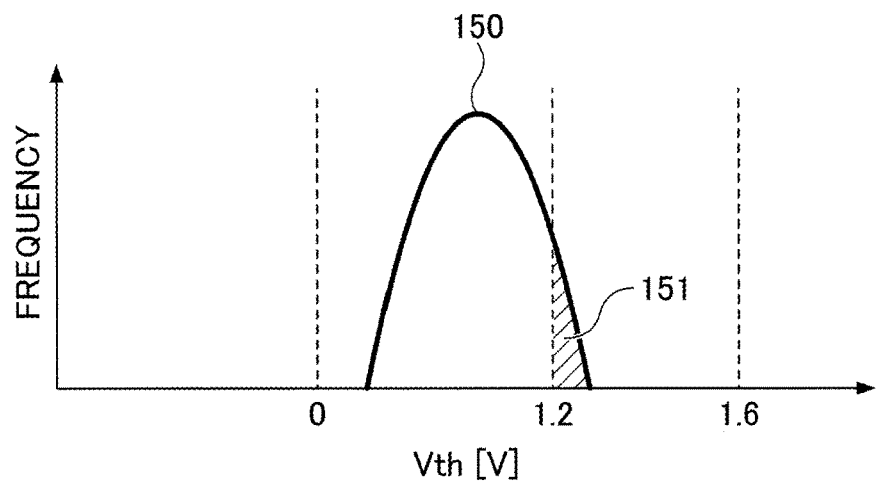
Figure 7C:
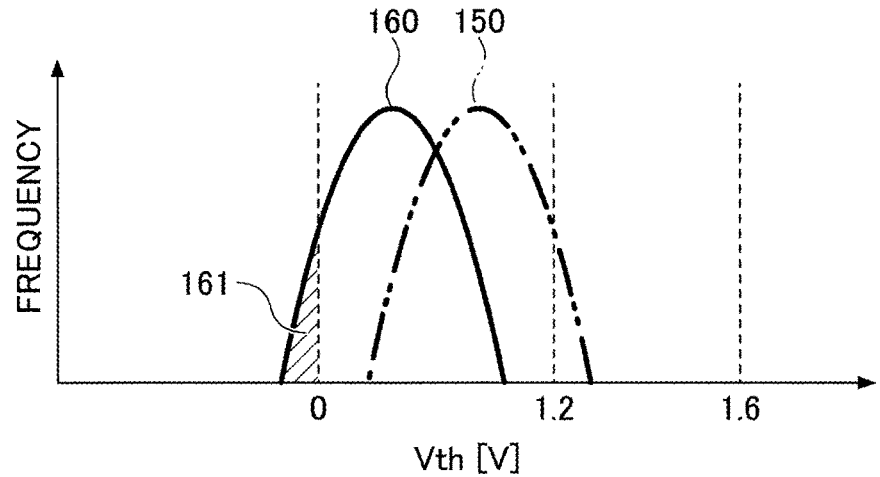

7B, and FIG. 7C are diagrams illustrating distributions of the threshold voltage of the selection transistor in the second reference example.

For example, it is conceivable to lower the voltage applied to the well 101, the impurity diffusion region 102c, and the control gate 124. In this case, in the selected memory cell, a voltage lower than 1.6 V, such as a voltage of 1.2 V, for example, is applied to the gate electrode 112. In other words, compared to the example illustrated in FIG. 6A, the voltage applied to the gate electrode 112 is 0.4 V lower. The leak current can be reduced by an amount corresponding to the amount the voltage applied to the gate electrode 112 is lower compared to the example illustrated in FIG. 6A. However, as illustrated in FIG. 7A, even if a distribution 150 of the threshold voltage Vth of the selection transistor 110 falls within the range that is 0 V or higher and 1.6 V or lower, a selection transistor 110 having the threshold voltage Vth higher than 1.2 V may exist. In other words, as illustrated in FIG. 7B, the distribution 150 includes a region 151 in which the threshold voltage Vth is higher than 1.2 V, and the selection transistor 110 having the threshold voltage Vth higher than 1.2 V will not turn on even if the voltage of 1.2 V is applied to the gate electrode 112 at the time when the memory cell is selected. Accordingly, an error may be generated in the data judgment of the selected memory cell.

In order to eliminate the error in the data judgment of the selected memory cell in which the selection transistor 110 has the threshold voltage Vth higher than 1.2 V, it is conceivable to shift the threshold voltage Vth of the selection transistor 110 to a lower voltage. The threshold voltage Vth may be adjusted by the impurity concentration or the like. In this case, a voltage of 0 V is applied to the gate electrode 112 in the non-selected memory cell. In addition, as illustrated in FIG. 7C, a distribution 160 of the threshold voltage Vth of the selection transistor 110 is shifted to the lower voltage compared to the distribution 150, and it is possible to eliminate the selection transistor 110 having the threshold voltage Vth higher than 1.2 V. However, a selection transistor 110 having the threshold voltage Vth lower than 0 V may exist. In other words, as illustrated in FIG. 7B, the distribution 160 includes a region 161 in which the threshold voltage Vth is lower than 0 V, and the selection transistor 110 having the threshold voltage Vth lower than 0 V will remain on even if the voltage of 1.2 V is applied to the gate electrode 112 at the time when the memory cell is non-selected. Accordingly, an error may be generated in the data judgment of another memory cell that shares the bit line BL with the non-selected memory cell.

Hence, according to the second reference example, the leak current also cannot be avoided. In addition, in a case in which the applied voltage is lowered or the threshold voltage Vth is changed in the second reference example, the data judgment may be adversely affected thereby.

The present inventors conceived embodiments described hereinafter, based on analysis of the reference examples described above.

A description will now be given of a nonvolatile semiconductor memory device in each embodiment according to the present invention.

First Embodiment

A first embodiment will be described. In the first embodiment, the nonvolatile semiconductor memory device (or nonvolatile memory) includes the 2Tr cell that uses p-channel MOS transistors for the p-channel field effect transistors forming the selection transistor 110 and the memory transistor 120. Accordingly, the conductivity type of the well 101 is the n-type, and the conductivity type of the impurity diffusion regions 102a, 102b, and 102c is the p-type. In addition, in the first embodiment, the threshold voltage Vth of the selection transistor 110 is −1.2 V or higher and 0.2 V or lower.

Next, the operation of the nonvolatile memory in the first embodiment will be described.

At the time of the data write, a voltage of 5 V is applied to the well 101 and the impurity diffusion region 102c, a voltage of 9 V is applied to the control gate 124, and a voltage of 0 V is applied to the gate electrode 112 and the impurity diffusion region 102a, similarly as in the case of the first reference example. By applying such voltages, electrons are injected into the floating gate 122 utilizing the impact ionization, to write the data.

At the time of the data erase, a voltage of 8 V is applied to the well 101, the impurity diffusion region 102a, and the impurity diffusion region 102c, a voltage of −8 V is applied to the control gate 124, and a voltage of 4 V is applied to the gate electrode 112, similarly as in the case of the first reference example. By applying such voltages, electrons injected into the floating gate 122 are extracted from the well 101 utilizing the Fowler-Nordheim (FN) tunneling, to erase the data.

At the time of the data read, voltages different from those applied in the first reference example are applied to the memory cell. In other words, at the time of the data read, a voltage of 1.2 V is applied to the well 101, the impurity diffusion region 102c, and the control gate 124, and a voltage of 0 V is applied to the impurity diffusion region 102a. In addition, a voltage of 0 V is applied to the gate electrode 112 when the memory cell is selected, and a voltage of 1.4 V is applied to the gate electrode 112 when the memory cell is in standby or non-selected.

The following Table 3 illustrates these voltages that are summarized.

TABLE 3

| | Reference Numeral | | | | |
|---|---|---|---|---|---|
| | 102a | 112 | 124 | 102c | 101 |
| Data Read | 0 V | 0 V/1.4 V (Selected/Non-Selected) | 1.2 V | 1.2 V | 1.2 V |
| Data Erase | 8 V | 4 V | −8 V | 8 V | 8 V |
| Data Write | 0 V | 0 V | 9 V | 5 V | 5 V |

Figure 8A:
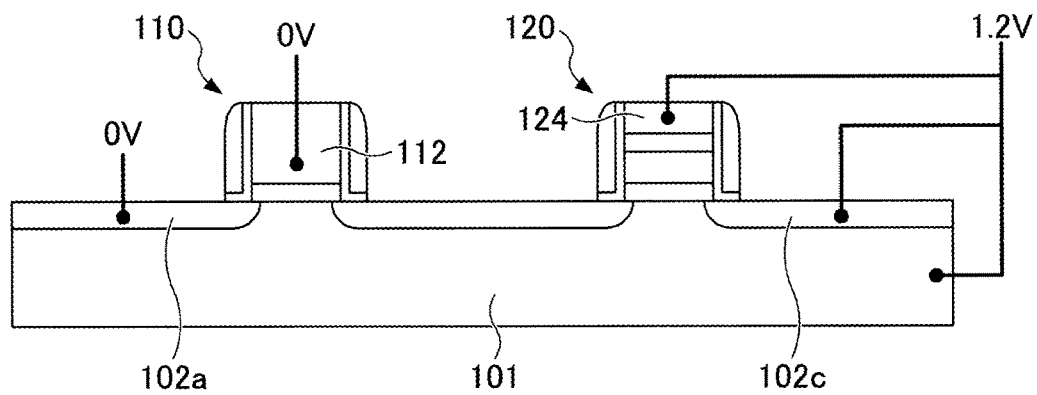
FIG. 8A, FIG. 8B, and FIG. 8C are diagrams illustrating voltages applied at the time of a data read and a distribution of a threshold voltage of a selection transistor in a first embodiment.
Figure 8B:
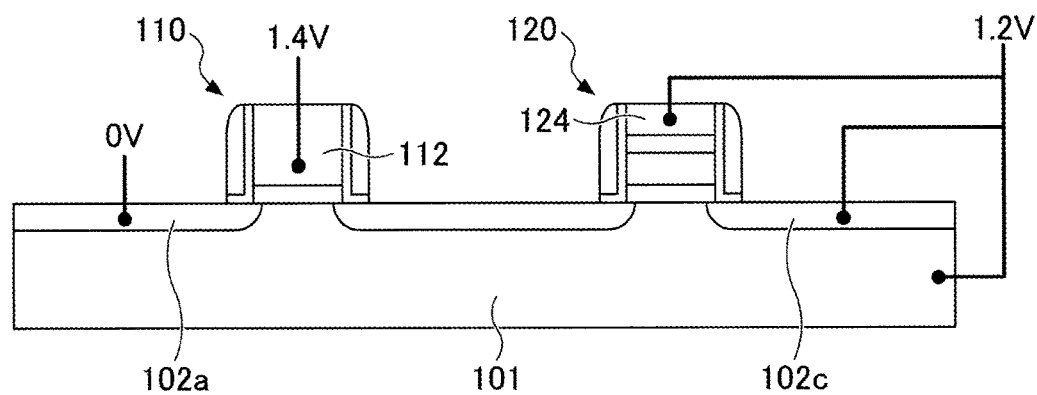
Figure 8C:
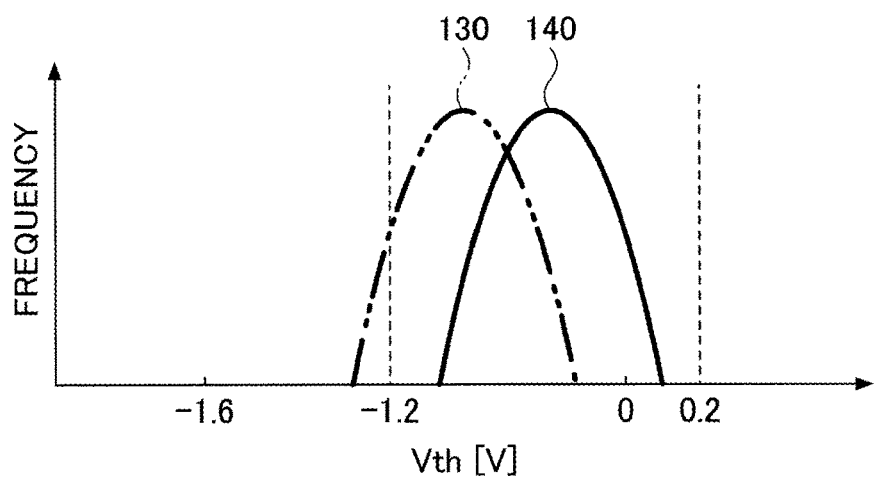

Next, the voltages applied at the time of the data read and a distribution of the threshold voltage of the selection transistor in the first embodiment will be described. FIG. 8A, FIG. 8B, and FIG. 8C are diagrams illustrating the voltages applied at the time of the data read and the distribution of the threshold voltage of the selection transistor in the first embodiment.

The voltages illustrated in FIG. 8A are applied to the selected memory cell. In this case, a gate-source voltage Vgs of the selection transistor 110 becomes −1.2 V. FIG. 8C illustrates the distribution 130 of the threshold voltage Vth of the selection transistor 110, and the distribution 140 that is shifted to a voltage range higher than the distribution 130, similarly as in the case of the first reference example illustrated in FIG. 5B. In this case, however, the distribution 140 of the threshold voltage Vth falls within a range that is −1.2 V or higher and 0.2 V or lower, and thus, the gate-source voltage Vgs becomes lower than the threshold voltage Vth. Accordingly, the selection transistor 110 turns on, and the data stored in the memory transistor 120 is read onto the bit line BL.

The voltages illustrated in FIG. 8B are applied to the non-selected memory cell. In this case, the gate-source voltage Vgs of the selection transistor 110 becomes 0.2 V. Because the distribution 140 of the threshold voltage Vth of the selection transistor 110 falls within the range that is −1.2 V or higher and 0.2 V or lower as illustrated in FIG. 8C, the gate-source voltage Vgs becomes higher than the threshold voltage Vth. Accordingly, the selection transistor 110 turns off, and the memory transistor 120 and the bit line BL become non-conducting with respect to each other.

In addition, in the first embodiment, the voltage (an example of a first voltage) of 1.2 V applied to the well 101 and the impurity diffusion region 102c at the time of the data read is smaller than an absolute value of the voltage (an example of a second voltage) of 1.4 V applied to the gate electrode 112 of the selection transistor 110 included in the non-selected memory cell. Accordingly, it is possible to reduce the leak current, particularly the leak current flowing to the bit line BL at the time when the memory cell is non-selected.

According to the first embodiment, the leak current can be reduced while normally turning on/off the selection transistor 110 at the time of the data read. Particularly by the reduction of the leak current flowing to the bit line BL at the time when the memory cell is non-selected, it is possible to reduce the error in the data judgment, and improve the reliability of the data judgment.

Further, compared to the first reference example, the voltages applied at the time of the data read in the first embodiment are lower. Accordingly, the lower voltages are effective in widening the range of the power source voltage and reducing the power consumption.

Second Embodiment

A second embodiment will be described. In the second embodiment, the nonvolatile semiconductor memory device (or nonvolatile memory) includes the 2Tr cell that uses the n-channel field effect transistors for the selection transistor 110 and the memory transistor 120. Accordingly, the conductivity type of the well 101 is the p-type, and the conductivity type of the impurity diffusion regions 102a, 102b, and 102c is the n-type. In addition, in the second embodiment, the threshold voltage Vth of the selection transistor 110 is −0.2 V or higher and 1.2 V or lower.

Next, the operation of the nonvolatile memory in the second embodiment will be described.

At the time of the data write, a voltage of 0 V is applied to the well 101 and the impurity diffusion region 102a, a voltage of 9 V is applied to the control gate 124, and a voltage of 5 V is applied to the impurity diffusion region 102c and the gate electrode 112, similarly as in the case of the second reference example. By applying such voltages, electrons are injected into the floating gate 122 utilizing the channel hot electrons, to write the data.

At the time of the data erase, a voltage of 8 V is applied to the well 101, the impurity diffusion region 102a, and the impurity diffusion region 102c, a voltage of −8 V is applied to the control gate 124, and a voltage of 4 V is applied to the gate electrode 112, similarly as in the case of the second reference example. By applying such voltages, electrons injected into the floating gate 122 are extracted from the well 101 utilizing the Fowler-Nordheim (FN) tunneling, to erase the data.

At the time of the data read, voltages different from those applied in the second reference example are applied to the memory cell. In other words, at the time of the data read, a voltage of 0 V is applied to the well 101, the impurity diffusion region 102c, and the control gate 124, and a voltage of 1 V is applied to the impurity diffusion region 102a. In addition, a voltage of 1.2 V is applied to the gate electrode 112 when the memory cell is selected, and a voltage of −0.2 V is applied to the gate electrode 112 when the memory cell is in standby or non-selected.

The following Table 4 illustrates these voltages that are summarized.

TABLE 4

| | Reference Numeral | | | | |
|---|---|---|---|---|---|
| | 102a | 112 | 124 | 102c | 101 |
| Data Read | 1 V | 1.2 V/−0.2 V (Selected/Non-Selected) | 0 V | 0 V | 0 V |
| Data Erase | 8 V | 4 V | −8 V | 8 V | 8 V |
| Data Write | 0 V | 5 V | 9 V | 5 V | 0 V |

Figure 9A:
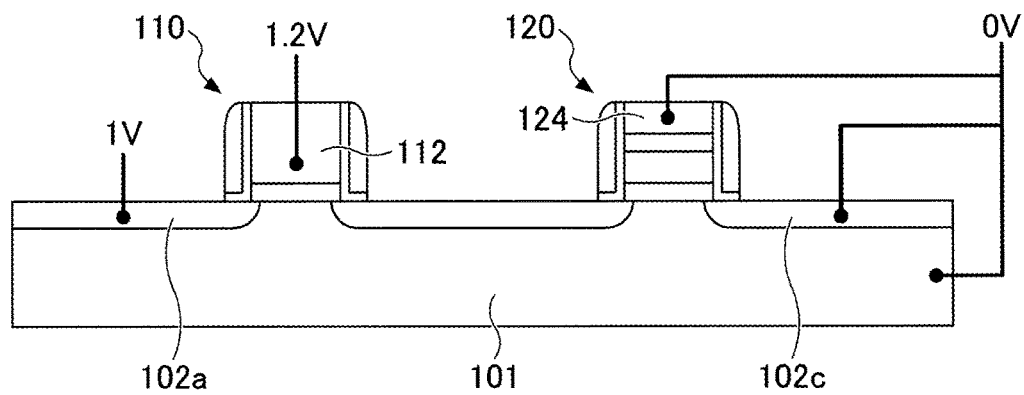
FIG. 9A, FIG. 9B, and FIG. 9C are diagrams illustrating the voltages applied at the time of the data read and the distribution of the threshold voltage of the selection transistor in a second embodiment.
Figure 9B:
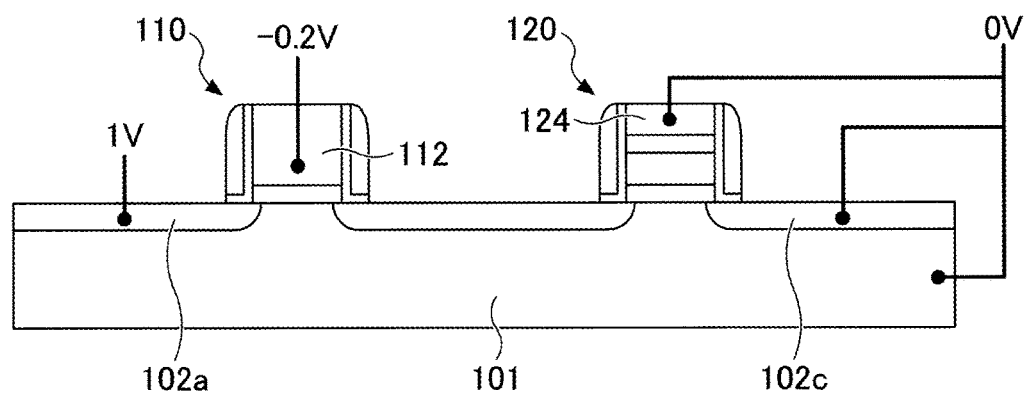
Figure 9C:
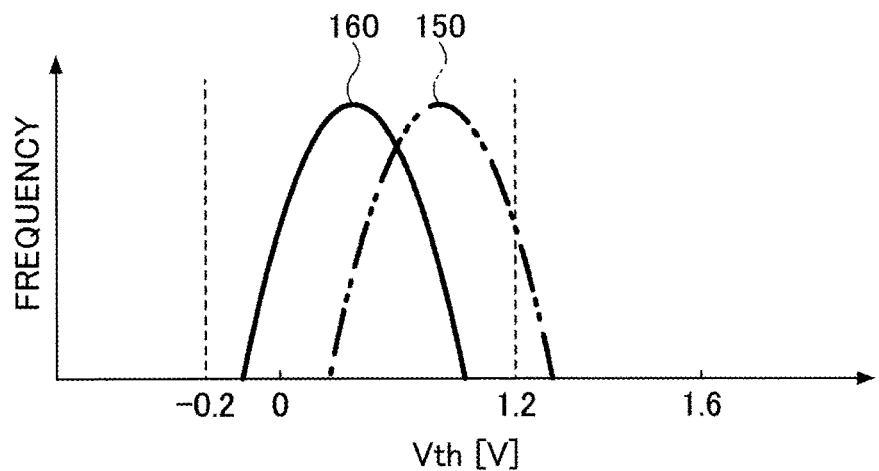

Next, the voltages applied at the time of the data read and a distribution of the threshold voltage of the selection transistor in the second embodiment will be described. FIG. 9A, FIG. 9B, and FIG. 9C are diagrams illustrating the voltages applied at the time of the data read and the distribution of the threshold voltage of the selection transistor in the second embodiment.

The voltages illustrated in FIG. 9A are applied to the selected memory cell. In this case, a gate-source voltage Vgs of the selection transistor 110 becomes 1.2 V. FIG. 9C illustrates the distribution 150 of the threshold voltage Vth of the selection transistor 110, and the distribution 160 that is shifted to a voltage range lower than the distribution 150, similarly as in the case of the second reference example illustrated in FIG. 7C. In this case, however, the distribution 160 of the threshold voltage Vth falls within a range that is −0.2 V or higher and 1.2 V or lower, and thus, the gate-source voltage Vgs becomes higher than the threshold voltage Vth. Accordingly, the selection transistor 110 turns on, and the data stored in the memory transistor 120 is read onto the bit line BL.

The voltages illustrated in FIG. 9B are applied to the non-selected memory cell. In this case, the gate-source voltage Vgs of the selection transistor 110 becomes −0.2 V. Because the distribution 160 of the threshold voltage Vth of the selection transistor 110 falls within the range that is −0.2 V or higher and 1.2 V or lower as illustrated in FIG. 9C, the gate-source voltage Vgs becomes lower than the threshold voltage Vth. Accordingly, the selection transistor 110 turns off, and the memory transistor 120 and the bit line BL become non-conducting with respect to each other.

In addition, in the second embodiment, the voltage (an example of a first voltage) of 0 V applied to the well 101 and the impurity diffusion region 102c at the time of the data read is smaller than an absolute value of the voltage (an example of a second voltage) of −0.2 V applied to the gate electrode 112 of the selection transistor 110 included in the non-selected memory cell. Accordingly, it is possible to reduce the leak current.

According to the second embodiment, the leak current can be reduced while normally turning on/off the selection transistor 110 at the time of the data read.

Further, compared to the second reference example, the absolute values of the voltages applied at the time of the data read in the second embodiment are lower. Accordingly, the lower absolute values of the voltages are effective in widening the range of the power source voltage and reducing the power consumption.

The voltage of −0.2 V may be generated using a negative charge pump (or negative voltage pump), for example. In order to employ a structure including no negative charge pump, the voltage applied to each node may be increased by 0.2 V at the time of the data read while adjusting the threshold voltage by the impurity concentration or the like. In other words, voltages illustrated in Table 5 may be applied to the memory cell.

TABLE 5

| | Reference Numeral | | | | |
|---|---|---|---|---|---|
| | 102a | 112 | 124 | 102c | 101 |
| Data Read | 1.2 V | 1.4 V/0 V (Selected/Non-Selected) | 0.2 V | 0.2 V | 0.2 V |
| Data Erase | 8 V | 4 V | −8 V | 8 V | 8 V |
| Data Write | 0 V | 5 V | 9 V | 5 V | 0 V |

Figure 10:
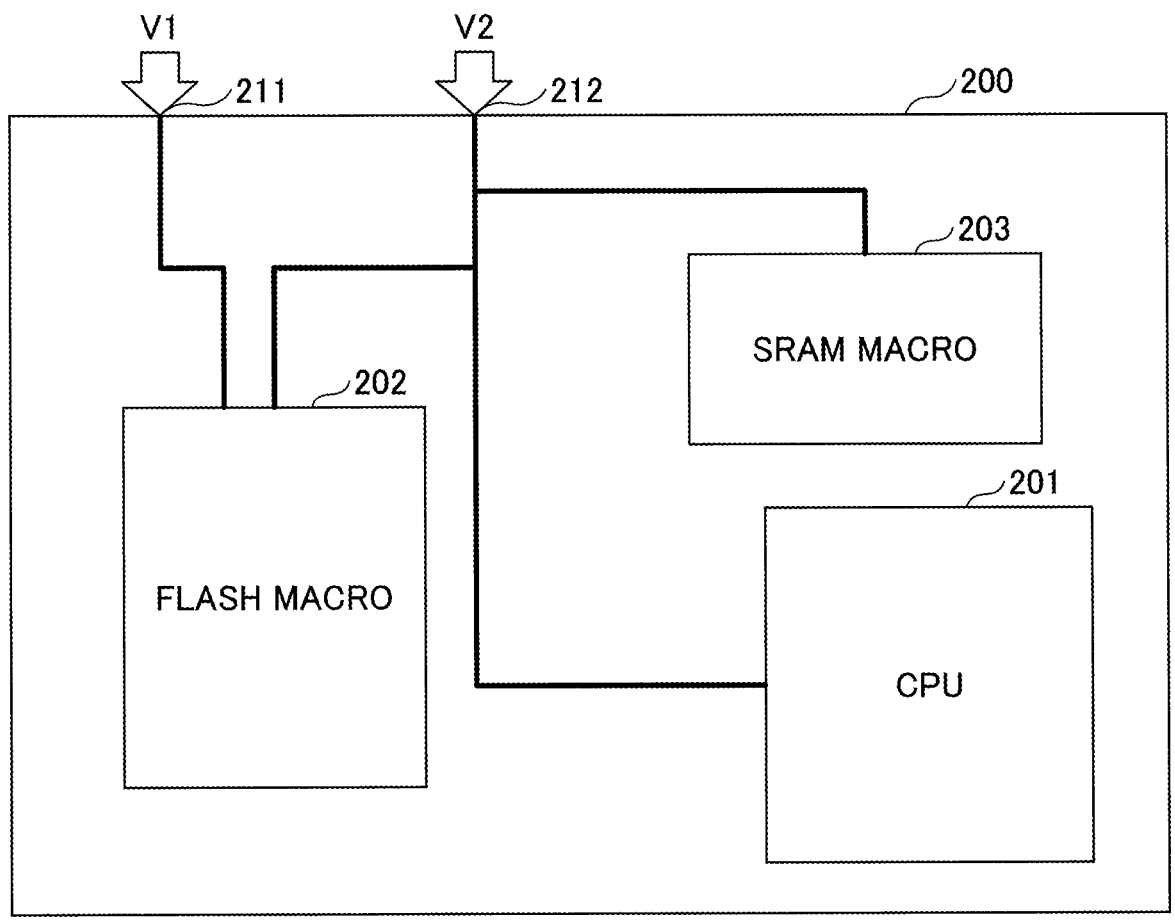
FIG. 10 is a diagram illustrating voltages supplied to a nonvolatile semiconductor memory device at the time of the data read.

Next, structures of reference examples that generate the voltages applied to the selection transistor 110 and the memory transistor 120 will be described. FIG. 10 is a diagram illustrating a circuit structure related to the data read of the nonvolatile memory at the time of the data read.

As illustrated in FIG. 10, a nonvolatile memory 200 includes a CPU (central Processing Unit) 201, a flash macro 202, and a SRAM (Static Random Access Memory) macro 203. The flash macro 202 includes a plurality of 2Tr cells that are arranged in an array, the SRAM macro 203 includes a plurality of SRAM cells arranged in an array, and the CPU 201 controls the flash macro 202 and the SRAM macro 203. The nonvolatile memory 200 includes an input part 211 to which a power source voltage V1 is input, and an input part 212 to which a power source voltage V2 lower than the power source voltage V1 is input. The power source voltage V1 is supplied to the flash macro 202, and the power source voltage V2 is supplied to the CPU 201, the flash macro 202, and the SRAM macro 203. For example, the power source voltage V1 is 3.0 V to 3.6 V, and the power source voltage V2 is 1.1 V to 1.3 V.

A power source voltage supply route within the flash macro 202 will be described based on the reference examples.

Third Reference Example

Figure 11:
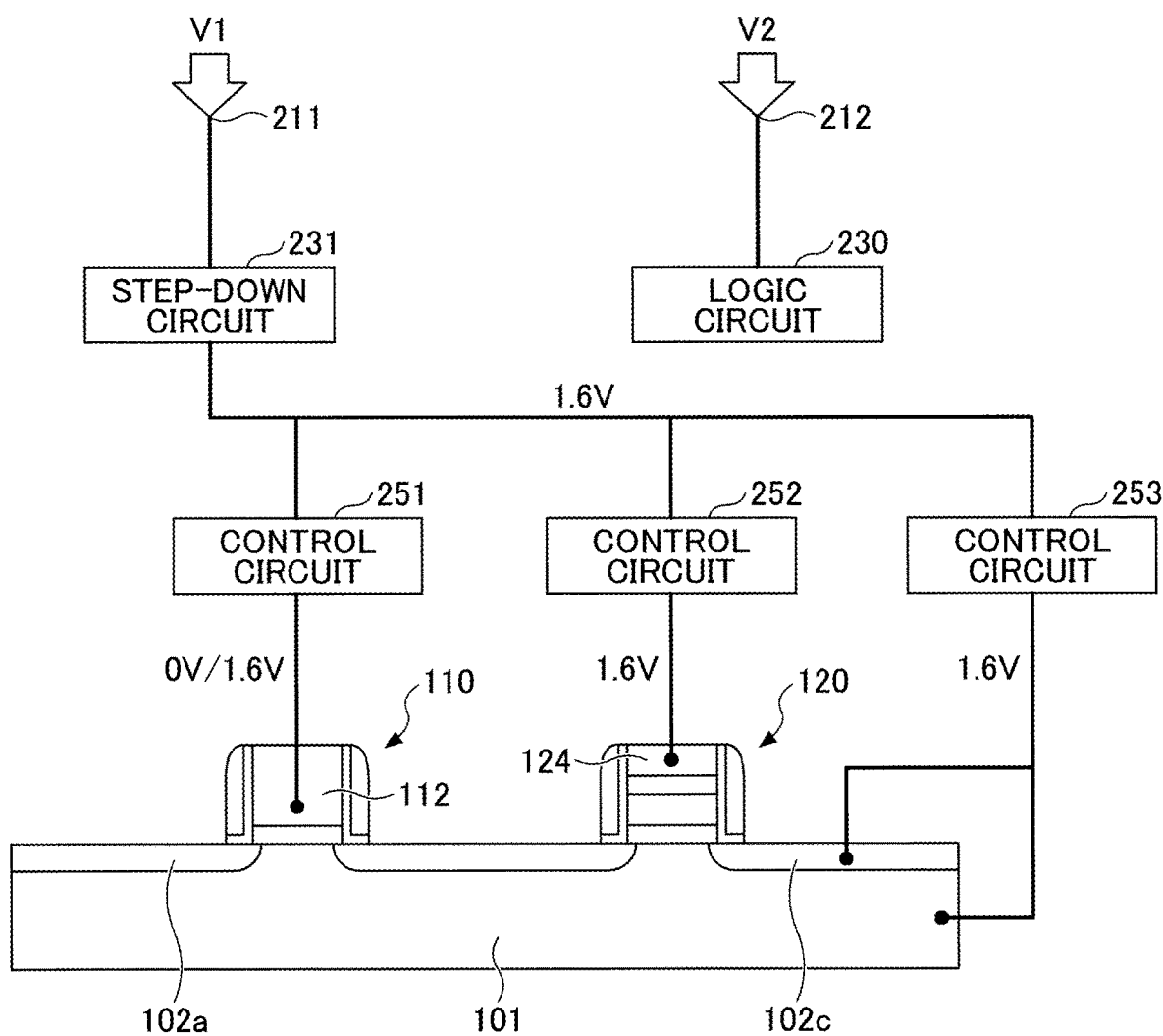
FIG. 11 is a diagram illustrating a power source voltage supply route in a third reference example.

A third reference example will be described. The third reference example relates to the power source voltage supply route in the first reference example, for example. FIG. 11 is a diagram illustrating the power source voltage supply route in the third reference example.

As illustrated in FIG. 11, the third reference example includes a step-down circuit 231 that steps down and lowers the power source voltage V1 of 3.0 V to 3.6 V to a voltage of 1.6 V. The third reference example includes, at a stage subsequent to the step-down circuit 231, a control circuit 251 that controls the voltage of the gate electrode 112, a control circuit 252 that controls the voltage of the control gate 124, and a control circuit 253 that controls the voltage of the well 101 and the impurity diffusion region 102c. The power source voltage V2 of 1.1 V to 1.3 V is supplied to a logic circuit 230, such as the CPU 201 or the like.

According to the third comparison example, it is possible to generate the voltages that are required to read the data, and supply the voltages to each of the nodes of the memory cell.

However, in a case in which a battery is used as a power source of the power source voltage V1, the power source voltage V1 gradually decreases. When the power source voltage V1 decreases below 1.6 V, the memory cell may no longer operate normally. Recently, there are sometimes demands to operate the memory cell at the power source voltage V1 in a range of 1.4 V to 3.6 V, however, the third reference example cannot meet such demands.

Fourth Reference Example

Figure 12:
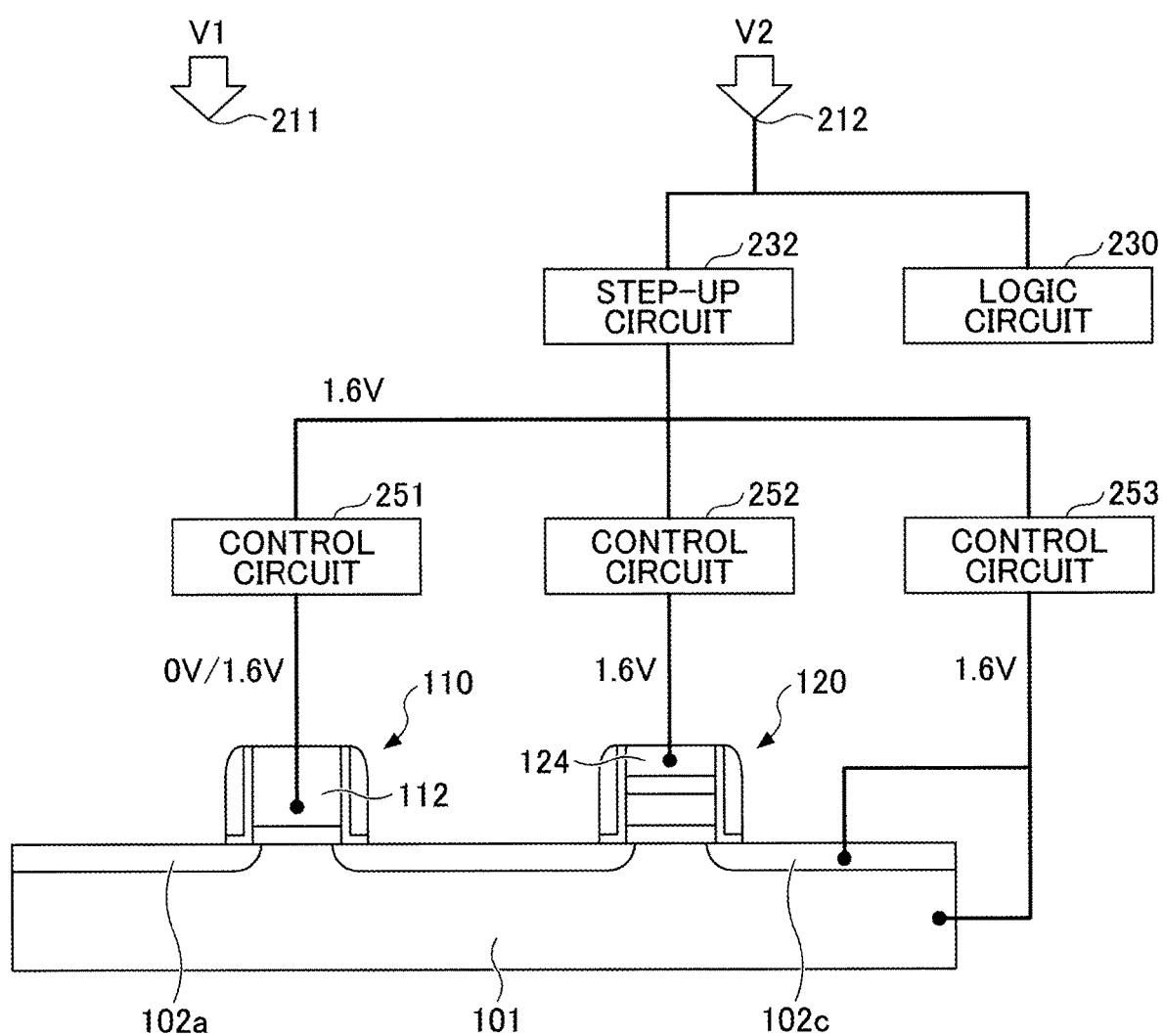
FIG. 12 is a diagram illustrating the power source voltage supply route in a fourth reference example.

A fourth reference example will be described. The fourth reference example relates to the power source voltage supply route in the first reference example, for example. FIG. 12 is a diagram illustrating the power source voltage supply route in the fourth reference example.

As illustrated in FIG. 12, the fourth reference example includes a step-up circuit 232 that steps up and raises the power source voltage V2 of 1.1 V to 1.3 V to a voltage of 1.6 V. The fourth reference example includes, at a stage subsequent to the step-up circuit 232, the control circuit 251 that controls the voltage of the gate electrode 112, the control circuit 252 that controls the voltage of the control gate 124, and the control circuit 253 that controls the voltage of the well 101 and the impurity diffusion region 102c. The power source voltage V2 of 1.1 V to 1.3 V is also supplied to the logic circuit 230, such as the CPU 201 or the like.

According to the fourth comparison example, it is possible to generate the voltages that are required to read the data, and supply the voltages to each of the nodes of the memory cell. In addition, even if the power source voltage V1 becomes lower than 1.6 V, it is possible to supply the voltage of 1.6 V. Accordingly, it is possible to meet the demands to operate the memory cell at the power source voltage V1 in the range of 1.4 V to 3.6 V. However, the step-up circuit 232 requires a large current, to thereby increase the power consumption.

The present inventors conceived the embodiments described hereinafter, based on analysis of the reference examples described above.

Third Embodiment

Figure 13:
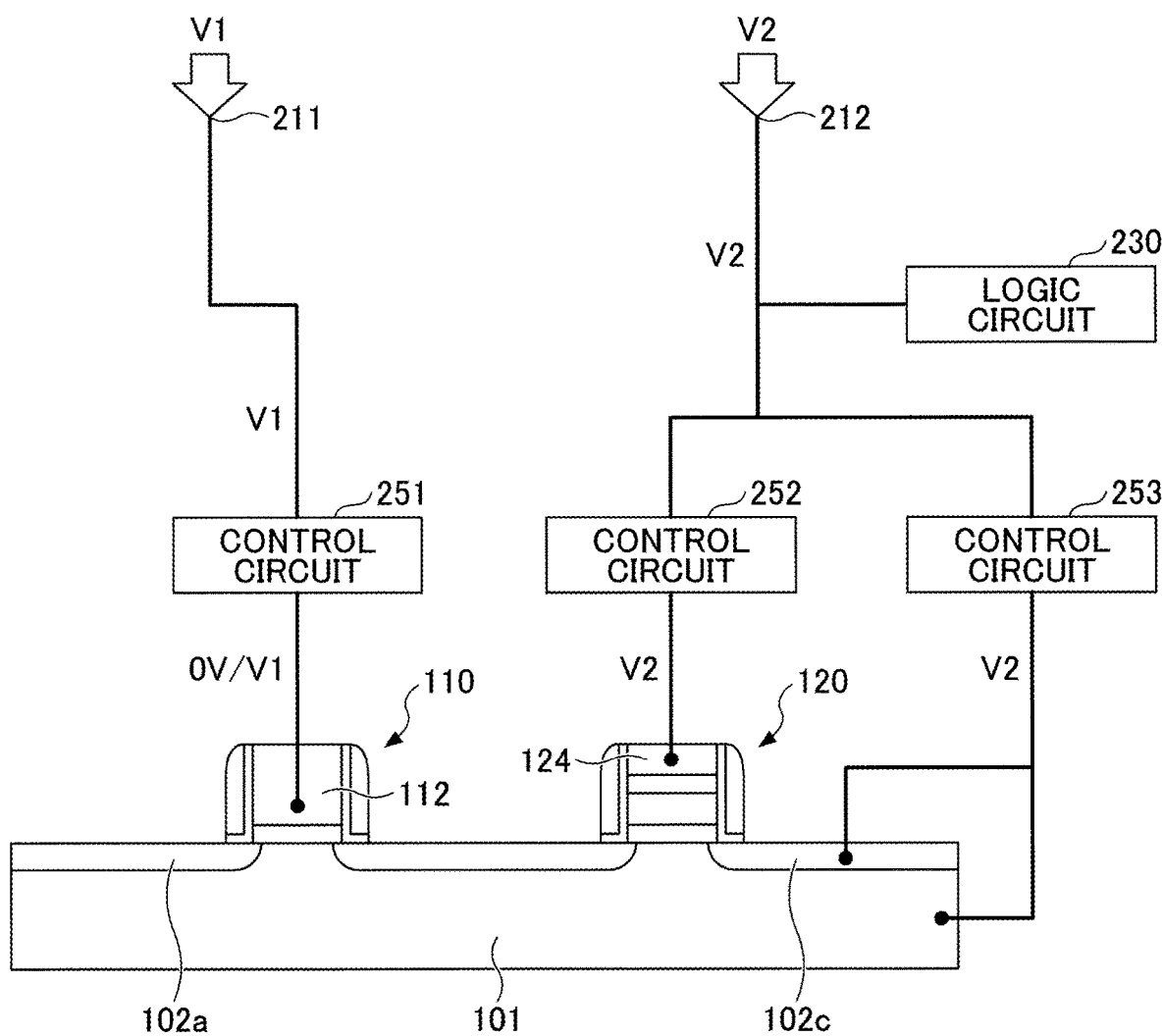
FIG. 13 is a diagram illustrating a power source voltage supply route in a third embodiment.

A third embodiment will be described. The third embodiment relates to the power source voltage supply route in the first embodiment, for example. FIG. 13 is a diagram illustrating the power source voltage supply route in the third embodiment.

As illustrated in FIG. 13, the nonvolatile semiconductor memory device in the third embodiment includes a control circuit 251 that controls the voltage of the gate electrode 112 of the selection transistor 110, and an input part 211 that inputs the power source voltage V1 to the control circuit 251. In the third embodiment, the control circuit 251 outputs the power source voltage V1 to the gate electrode 112 of the selection transistor 110 included in the non-selected memory cell. For example, the power source voltage V1 is 1.4 V to 3.6 V. The nonvolatile semiconductor memory device in the third embodiment further includes a control circuit 252 that controls the voltage of the control gate 124, a control circuit 253 that controls the voltage of the well 101 and the impurity diffusion region 102c, and an input part 212 that inputs the power source voltage V2 to the control circuits 252 and 253. At the time of the data read, the control circuit 252 outputs the power source voltage V2 to the control gate 124, and the control circuit 253 outputs the power source voltage V2 to the well 101 and the impurity diffusion region 102c. For example, the power source voltage V2 is 1.1 V to 1.3 V. P-channel field effect transistors are used for the selection transistor 110 and the memory transistor 120. The power source voltage V2 is also supplied to a logic circuit 230, such as the CPU 201 or the like.

As described above, at the time of the data read, the voltage applied to the gate electrode 112 of the nonvolatile memory in the first embodiment is 0 V or 1.4 V. Accordingly, even if the power source voltage V1 decreases to 1.4 V, the memory cell can still operate normally. In addition, because no step-down circuit 231 nor step-up circuit 232 is included in the nonvolatile memory, it is possible to eliminate current that is otherwise required to operate the step-down circuit 231 or the step-up circuit 232. Further, the voltage (V2) that is applied to the well 101 and the impurity diffusion region 102c from the control circuit 253 at the time of the data read is always smaller than the absolute value of the voltage (V1) that is applied to the gate electrode 112 of the selection transistor 110 included in the non-selected memory cell. Accordingly, similarly as in the case of the first embodiment, it is possible to reduce the leak current, particularly the leak current flowing to the bit line BL at the time when the memory cell is non-selected.

Fourth Embodiment

Figure 14:
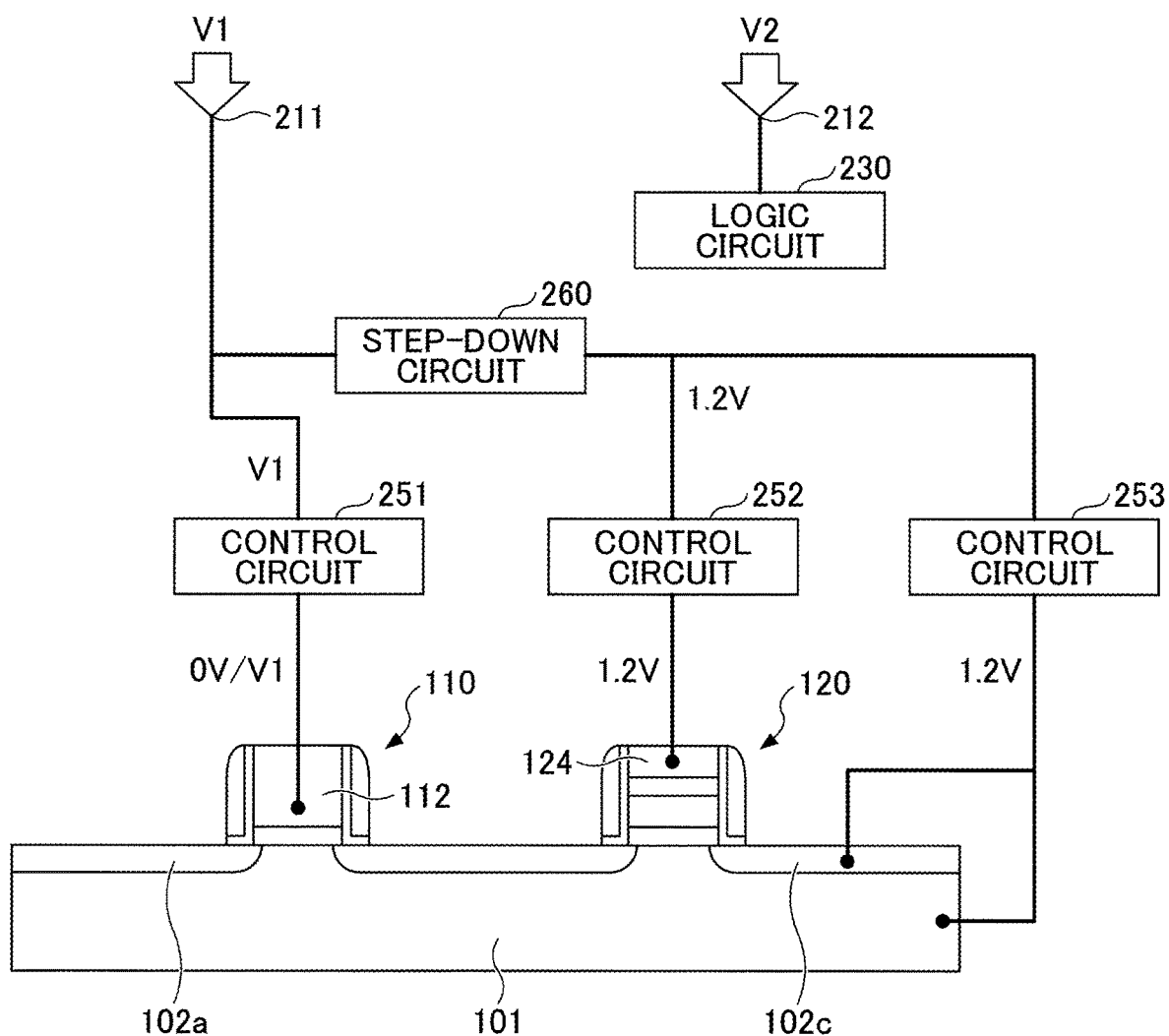
FIG. 14 is a diagram illustrating the power source voltage supply route in a fourth embodiment.

A fourth embodiment will be described. The fourth embodiment relates to the power source voltage supply route in the first embodiment, for example. FIG. 14 is a diagram illustrating the power source voltage supply route in the fourth embodiment.

As illustrated in FIG. 14, the nonvolatile semiconductor memory device in the fourth embodiment includes a control circuit 251 that controls the voltage of the gate electrode 112 of the selection transistor 110, and an input part 211 that inputs the power source voltage V1 to the control circuit 251. In the fourth embodiment, the control circuit 251 outputs the power source voltage V1 to the gate electrode 112 of the selection transistor 110 included in the non-selected memory cell, similarly as in the case of the third embodiment. For example, the power source voltage V1 is 1.4 V to 3.6 V. The nonvolatile semiconductor memory device in the fourth embodiment further includes an input part 212 that inputs the power source voltage V2, a step-down circuit 260 that steps down and lowers the power source voltage V1, a control circuit 252 that controls the voltage of the control gate 124, and a control circuit 253 that controls the voltage of the well 101 and the impurity diffusion region 102c. For example, the step-down circuit 260 steps down and lowers the power source voltage V1 to generate a voltage of 1.2 V. At the time of the data read, the control circuit 252 outputs the voltage of 1.2 V generated by the step-down circuit 260 to the control gate 124, and the control circuit 253 outputs the voltage of 1.2 V generated by the step-down circuit 260 to the well 101 and the impurity diffusion region 102c. P-channel field effect transistors are use for the selection transistor 110 and the memory transistor 120. The power source voltage V2 is supplied to a logic circuit 230, such as the CPU 201 or the like.

As described above, at the time of the data read, the voltage applied to the gate electrode 112 of the nonvolatile memory in the first embodiment is 0 V or 1.4 V. Accordingly, even if the power source voltage V1 decreases to 1.4 V, the memory cell can still operate normally. In addition, the voltage input to the control circuits 252 and 253 is generated from the power source voltage V1, and the flash macro 202 is unaffected even if the power source voltage V2 is decreased. Accordingly, it is possible to decrease the power source voltage V2 within an operable range of the logic circuit 230, and reduce the power consumption. For example, the power source voltage V2 may be 0.8 V to 1.0 V. Further, the voltage (1.2 V) that is applied to the well 101 and the impurity diffusion region 102c from the control circuit 253 at the time of the data read is always smaller than the absolute value of the voltage (V1) that is applied to the gate electrode 112 of the selection transistor 110 included in the non-selected memory cell, similarly as in the case of the third embodiment. Accordingly, similarly as in the case of the first embodiment, it is possible to reduce the leak current, particularly the leak current flowing to the bit line BL at the time when the memory cell is non-selected.

According to each of the embodiments described above, it is possible to provide a nonvolatile semiconductor memory device that can reduce the leak current.

Although the embodiments are numbered with, for example, "first," "second," "third," or "fourth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A nonvolatile semiconductor memory device comprising:
    a selection transistor and a memory transistor, that are p-channel field effect transistors, formed on a well for each of a plurality of memory cells,
    wherein the nonvolatile semiconductor memory device performs a data read from the memory transistor in a state where
        a first voltage is applied to the well and a source of the memory transistor,
        a second voltage is applied to a gate of the selection transistor included in a non-selected memory cell among the plurality of memory cells, and
        a third voltage is applied to a drain of the selection transistor,
    wherein the second voltage is a positive voltage higher than the first voltage, and the first voltage is a positive voltage higher than the third voltage.

2. The nonvolatile semiconductor memory device as claimed in claim 1, wherein the nonvolatile semiconductor memory device performs the data read from the memory transistor in the state where the first voltage is further applied to a control gate of the memory transistor.

3. The nonvolatile semiconductor memory device as claimed in claim 1, further comprising:
a first control circuit configured to control a gate voltage of the selection transistor; and
a first input part configured to input a first power source voltage to the first control circuit,
wherein the first control circuit outputs the first power source voltage as the second voltage.

4. The nonvolatile semiconductor memory device as claimed in claim 3, further comprising:
a second control circuit configured to control a voltage of the well and the source of the memory transistor; and
a second input part configured to input a second power source voltage lower than the first power source voltage to the second control circuit,
wherein the second control circuit outputs the second power source voltage as the first voltage.

5. The nonvolatile semiconductor memory device as claimed in claim 4, further comprising:
a logic circuit configured to operate at the second power source voltage.

6. The nonvolatile semiconductor memory device as claimed in claim 3, further comprising:
a step-down circuit configured to step down and lower the first power source voltage and generate the first voltage; and
a second control circuit configured to control a voltage of the well and the source of the memory transistor,
wherein the second control circuit outputs the first voltage generated by the step-down circuit.

7. The nonvolatile semiconductor memory device as claimed in claim 1, wherein the nonvolatile semiconductor memory device performs the data read from the memory transistor in the state where the third voltage is applied to the gate of the selection transistor included in a selected memory cell among the plurality of memory cells.

8. The nonvolatile semiconductor memory device as claimed in claim 7, wherein the third voltage is zero.

9. The nonvolatile semiconductor memory device as claimed in claim 1, wherein a threshold voltage of the selection transistor is higher than or equal to a gate-source voltage of the selection transistor included in a selected memory cell among the plurality of memory cells, and lower than or equal to a gate-source voltage of the selection transistor included in the non-selected memory cell among the plurality of memory cells.

10. A nonvolatile semiconductor memory device comprising:
a selection transistor and a memory transistor, that are n-channel field effect transistors, formed on a well for each of a plurality of memory cells,
wherein the nonvolatile semiconductor memory device performs a data read from the memory transistor in a state where
a first voltage is applied to the well and a source of the memory transistor,
a second voltage is applied to a gate of the selection transistor included in a non-selected memory cell among the plurality of memory cells, and
a third voltage is applied to a drain of the selection transistor,
wherein the second voltage is lower than the first voltage, and the third voltage is a positive voltage higher than the first voltage.

11. The nonvolatile semiconductor memory device as claimed in claim 10, wherein the nonvolatile semiconductor memory device performs the data read from the memory transistor in the state where the first voltage is further applied to a control gate of the memory transistor.

12. The nonvolatile semiconductor memory device as claimed in claim 10, wherein the nonvolatile semiconductor memory device performs the data read from the memory transistor in the state where a fourth voltage is applied to the gate of the selection transistor included in a selected memory cell among the plurality of memory cells, and the fourth voltage is a positive voltage higher than the third voltage.

13. The nonvolatile semiconductor memory device as claimed in claim 12, wherein the first voltage is zero, and the second voltage is a negative voltage.

14. The nonvolatile semiconductor memory device as claimed in claim 12, wherein the first voltage is a positive voltage, and the second voltage is zero.

15. The nonvolatile semiconductor memory device as claimed in claim 10, wherein a threshold voltage of the selection transistor is higher than or equal to a gate-source voltage of the selection transistor included in the non-selected memory cell among the plurality of memory cells, and lower than or equal to a gate-source voltage of the selection transistor included in a selected memory cell among the plurality of memory cells.

* * * * *